United States Patent [19]

Yasue et al.

[11] Patent Number: 5,013,614

[45] Date of Patent: May 7, 1991

[54] SURFACE TREATED STEEL PLATE FOR CANS

[75] Inventors: Yoshihiko Yasue; Hiroshi Kagechika, both of Tokyo, Japan

[73] Assignee: NKK Corporation, Tokyo, Japan

[21] Appl. No.: 530,604

[22] Filed: May 30, 1990

[30] Foreign Application Priority Data

Jun. 13, 1989 [JP] Japan .................................. 1-150194

[51] Int. Cl.⁵ .................... B32B 15/10; B32B 15/00; B65D 90/04
[52] U.S. Cl. .................................... 428/651; 428/648; 428/653; 428/656; 428/667; 220/456
[58] Field of Search ............... 428/646, 648, 666, 667, 428/651, 653; 220/456

[56] References Cited

U.S. PATENT DOCUMENTS

| | | | |
|---|---|---|---|
| 2,544,671 | 3/1951 | Grange et al. | 428/653 |
| 3,093,885 | 6/1963 | Morrison et al. | 428/653 |
| 3,386,161 | 6/1968 | Ruf | 428/653 |
| 4,454,960 | 6/1984 | Imazu et al. | 220/456 |
| 4,541,546 | 9/1985 | Imazu et al. | 220/456 |
| 4,906,533 | 3/1990 | Kagechika et al. | 428/667 |

FOREIGN PATENT DOCUMENTS

| | | | |
|---|---|---|---|
| 55-82797 | 6/1980 | Japan | |
| 56-98444 | 8/1981 | Japan | 428/653 |

Primary Examiner—R. Dean
Assistant Examiner—Robert R. Koehler
Attorney, Agent, or Firm—Frishauf, Holtz, Goodman & Woodward

[57] ABSTRACT

Disclosed is a surface treated steel plate for cans prepared by drawing and ironing (DI process). In order to enable the manufactured can to maintain a good weatherability and a high corrosion resistance, an Al-Sn alloy film having a thickness of 0.05 to 5.0 μm is formed on at least that surface of a steel plate which faces the outside when the steel plate is drawn to have a cup shape.

13 Claims, 1 Drawing Sheet

SURFACE TREATED STEEL PLATE FOR CANS

BACKGROUND OF THE INVENTION

1. Field of the Invention

The present invention relates to a surface treated steel plate for cans, particularly, to a surface treated steel plate used for the manufacture of a drawn and ironed can, hereinafter referred to as "DI can", i.e., a two-piece can which is manufactured by drawing a disk-shaped steel plate prepared by punching into a cup shape, followed by ironing the barrel portion of the cup-shaped steel plate so as to decrease the thickness thereof.

2. Description of the Related Art

Cans for loading food, which are formed of a tin-plated steel plate, a chromium-plated steel plate, an aluminum sheet, etc., are classified into a three-piece can and a DI can depending on the structure of the can. For manufacturing the three-piece can, a lid portion, a barrel portion and a bottom portion, which are prepared separately, are subjected to various processes including the soldering, welding and fastening processes so as to obtain the desired can. On the other hand, the barrel portion and the bottom portion are formed integrally in a cup shape in the manufacture of the DI can, followed by attaching a lid to the cup-shaped structure. To be more specific, the manufacturing process of the DI can comprises a first stage of drawing a disk-shaped metal sheet prepared by punching into a cup shape, and a second stage of passing the cup-shaped steel plate through a die, i.e., an ironing treatment, such that the barrel portion of the cup-shaped steel plate passes through a small clearance formed between the outer die and the inner punch. Naturally, the thickness of the metal plate in the barrel portion is gradually decreased, and the barrel portion is elongated during the ironing treatment. The treatment including the first and second stages described above is called DI process in the following description.

The DI can prepared by the DI process is smaller in the thickness of the metal plate and lighter in weight than the three-piece can. In addition, seamless between the barrel and the bottom of the DI can prevents a liquid food or the like housed in the can from leaking to the outside. Because of these merits, the demands for the DI can are sharply on the increase and are expected to continue to be on the increase in the future.

Presently, surface treated steel plates such as a tin-plated steel plate and aluminum plates are used as the raw material of a DI can. In particular, the surface treated steel plate is cheaper than the aluminum plate and, thus, the demands for the surface treated steel plate are expected to further increase in the future. However, a very severe processing is required in the step of integrally forming the barrel portion and the bottom portion in the manufacture of the DI can, as described above. Particularly, the plated skin layer forming the surface layer of the surface treated steel plate is subjected to severe conditions. As a result, it is unavoidable for the plated skin layer to be deteriorated, when the tin-plated steel plate or the chromium-plated steel plate used as the conventional can material is subjected to the DI process. In the case of, for example, a tin-plated steel plate, the tin layer covering the surface of the steel plate serves to ensure a high corrosion resistance of the plated steel plate and, at the same time, plays the roll of a lubricant in the ironing process. Thus, the plated tin layer is highly desirable when applied to the outer surface, i.e., the outer surface of the cup-shaped steel plate, of the steel plate used for the DI process.

However, the tin-plated steel plate leaves room for further improvement. Specifically, the plated tin layer on the inner surface of the cup-shaped steel plate is brought into direct contact with the punch in the ironing process, with the result that the plated tin layer is cracked so as to expose the steel plate itself to the outside. The exposure causes deterioration in the secondary corrosion resistance after the coating of the inner surface of the can body, giving rise to the undercutting corrosion. As a result, iron is eluted into the material such as beverage loaded in the can. In this case, the life of the can is shortened. In addition, the taste and flavor of the loaded beverage are impaired.

To overcome the difficulty described above, it was customary in the past to apply a sealing treatment with a phosphoric acid series treating solution or a chromium phosphate series treating solution so as to form a sealing layer covering the exposed surface of the steel plate. However, such a sealing treatment fails to sufficiently improve the corrosion resistance on the inner surface of the can body, making it necessary to apply a coating treatment with an organic film a plurality of times so as to ensure a sufficient corrosion resistance. Needless to say, however, these treatments lead to an increased manufacturing cost of the can.

In some cases, cans manufactured by the DI process are used with no coating applied to the external ring portion at the bottom of the can. Of course, the cans tend to be rusted during the storage or transportation.

In the case of a chromium-plated steel plate, the surface of the steel plate is covered first with a chromium plating layer electrolytically formed by using an aqueous solution and then with a hydrated chromium oxide layer. In this case, the chromium plating layer is hard, with the result that the surface layers are damaged during the DI process, as in the tin-plated steel plate. A measure for overcoming the difficulty is proposed in, for example, Published Unexamined Japanese Patent Application No. 55-82797. It is proposed that a thermosetting coating material is applied to both surfaces of the steel plate so as to allow the coating to perform a lubricating function and to enable the steel plate to exhibit an improved corrosion resistance. However, the improvement in the corrosion resistance is not satisfactory in spite of the presence of the thermosetting coating layer. In addition, the coating layer causes the can body to be adhered to the punch during the ironing process, making it necessary to withdraw the punch with force greater than the mechanical strength of the can body. It follows that a so-called "roll back", i.e., occurrence of warping in the upper peripheral portion of the barrel portion of the can body, tends to take place. Under the circumstances, a chromium-plated steel plate has not yet been put to a practical use for the manufacture of cans.

The present inventor has conducted researches on the DI processing capability and corrosion resistance of a steel plate covered with a single or a plurality of aluminum plating layers for improving the corrosion resistance. It has been found that a mold biting takes place during the DI process, leading to a marked deterioration in the appearance of the manufactured cans.

As described above, the conventional surface treated steel plates are not satisfactory in various aspects. To reiterate, the tin-plated steel plate necessitates a sealing treatment after the DI process. On the other hand, the chromium-plated metal plate requires a coating treatment with a thermosetting coating material. In addition, the metal plate fails to exhibit a sufficiently high corrosion resistance in spite of the presence of the coating layer. Also, an excessive force is required for withdrawing the punch after the DI process, giving rise to the roll back problem. Further, a mold biting takes place in the case of a steel plate covered with an aluminum surface layer, leading to a shortened life of the die.

SUMMARY OF THE INVENTION

An object of the present invention is to provide a surface treated steel plate for two-piece cans (DI cans) exhibiting a good DI processing capability, the outer surface of said steel plate exhibiting an excellent weatherability and a high corrosion resistance because of the presence of a coating layer, and to provide a method of manufacturing said surface treated steel plate.

Another object is to provide a two-piece can manufactured from the surface treated steel plate noted above and a method of manufacturing the two-piece can.

To achieve the objects noted above, the surface treated steel plate of the present invention comprises a steel plate and an Al-Sn alloy film having a thickness of 0.05 to 5.0 $\mu$m. The alloy film is formed on at least that surface of the steel plate which faces the outside when the steel plate is drawn into a cup shape. Also, at least the above-noted surface of the steel plate is covered with an under layer of a chromium film having a thickness of 0.01 to 1.0 $\mu$m and an upper layer of an Al-Sn alloy film having a thickness of 0.05 to 5.0 $\mu$m.

In order to obtain a sufficient lubricity during the DI process of the steel plate, it is necessary for the Al-Sn alloy to contain at least 1% by weight, preferably 5 to 6% by weight, of Sn. Also, it is possible to use a chromium alloy film containing at least one kind of another element such as Ni in place of the chromium film noted above, as far as the chromium alloy film is substantially equal to the chromium film in the properties.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS accompanying drawing, which is incorporated in and constitutes a part of the specification, illustrates presently preferred embodiments of the invention and, together with the general description given above and the detailed description of the preferred embodiments given below, serves to explain the principles of the invention.

FIGS. 1A and 1B are cross sectional views each schematically showing an example of a surface treated steel plate of the present invention; and FIG. 2 schematically shows a can manufactured from the surface treated steel plate of the present invention.

DETAILED DESCRIPTION OF THE PREFERRED EMBODIMENTS

Figure 1A:
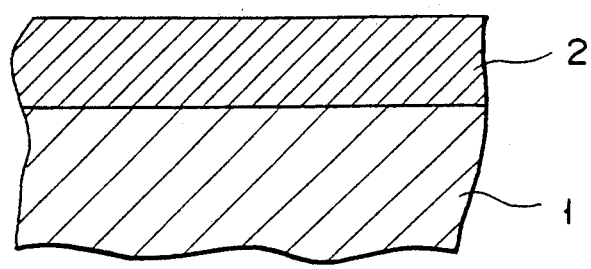
Figure 1B:
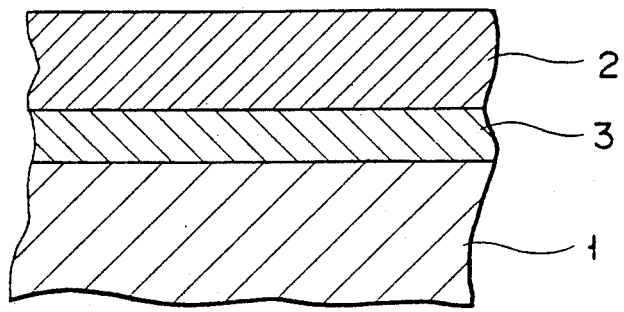

As shown in FIG. 1, a surface treated steel plate of the present invention comprises a steel plate 1 and an Al-Sn alloy surface layer 2 formed on the surface of the steel plate 1. In general, the steel plate 1 is formed of a low carbon aluminum killed steel having a thickness of 0.10 mm to 0.5 mm, which is prepared by a process including the cold rolling, defatting and acid washing treatments. In order to ensure the DI processing capability of the surface treated steel plate, the Al-Sn alloy surface layer 2 is formed on at least that surface of the steel plate 1 which faces the outside when the steel plate 1 is drawn into a cup shape. The Al-Sn series alloy is of a eutectic reaction type and, thus, do not form a solid solution. When it comes to an Al-Sn alloy plating material prepared by the vacuum vapor deposition or melting method, the Al phase and the Al-Sn eutectic phase are present together. It should be noted that the Sn contained in the Al-Sn alloy film 2 comes out because of the frictional heat during the DI process so as to act as a lubricant. As a result, the surface treated steel plate of the present invention exhibits an excellent lubricating properties, making it possible to achieve the DI process accurately. In order to obtain a sufficient lubricity during the DI process, it is necessary for the Al-Sn alloy to contain at least 1% by weight of Sn. If the Sn content exceeds 60% by weight, however, the weatherability of the alloy is lowered. In addition, the Sn content exceeding 60% by weight is economically undesirable because Sn is costly. In view of the lubricity and corrosion resistance, the Sn content should desirably be 5 to 60% by weight. On the other hand, the alloy film 2 should be at least 0.05 $\mu$m thick in order to obtain a sufficient lubricity, though the alloy film having a thickness of more than 5 $\mu$m is economically undesirable. In short, the thickness of the Al-Sn alloy film should fall within the range of between 0.05 $\mu$m and 5.0 $\mu$m.

Where the can is severely corroded by the material housed therein or by the storing environment, it is desirable to form a chromium film 3 in a thickness of 0.01 to 1.0 $\mu$m between the Al-Sn alloy film 2 and the steel plate 1, as shown in FIG. 1B. The chromium film 3 uniformly covers the surface of the steel plate so as protect the steel plate. In addition, chromium exhibits a high resistance to polarization so as to suppress the sacrificial dissolution of the Al-Sn alloy film. It follows that the chromium film 3 serves to prolong the life of the can. In order to obtain a sufficient protective effect, the chromium film 3 should be at least 0.01 1.0$\mu$m thick. However, the thickness exceeding 1.0 $\mu$m is economically undesirable. It follows that the thickness of the chromium film 3 should fall within the range of between 0.01 $\mu$m and 1.0 $\mu$m.

Figure 2:
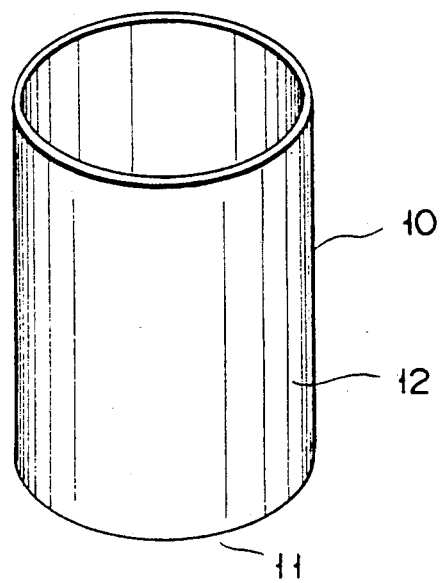

The surface treated steel plate of the present invention is punched into a disk. The disk-like steel plate is drawn into a cup shape having a bottom portion 11 and a barrel portion 12, followed by ironing the cup shaped body so as to obtain a can 10 having a thin barrel portion, as shown in FIG. 2.

EXAMPLE 1

Six samples (sample Nos. 1 to 6) of surface treated steel plate constructed as shown in FIG. 1A and four samples (sample Nos. 7 to 10) of surface treated steel plate constructed as shown in FIG. 1B were prepared by using a vacuum vapor deposition apparatus provided with two water-cooled crucibles. In each of sample Nos. 1 to 6, both surfaces of a low carbon aluminum killed steel plate having a thickness of 0.3 mm were plated with an Al-Sn alloy by means of vacuum vapor deposition so as to form an Al-Sn alloy film containing 5 to 48% by weight of Sn and having a thickness of 0.5 to 4.3 μm. In each of sample Nos. 7 to 10, one surface of the steel plate as used in sample Nos. 1 to 6 was plated first with chromium by means of ion plating so as to form a chromium film having a thickness of 0.03 to 0.75 μm, followed by forming on the chromium film an Al-Sn film containing 11 to 54% by weight of Sn and having a thickness of 0.6 to 3.7 μm by means of vacuum vapor deposition

EXAMPLE 2

Four samples (sample Nos. 11-14) of surface treated steel plate constructed as shown in FIG. 1A, i.e., steel plate plated with an Al-Sn alloy, were prepared by the process comprising the steps of defatting a low carbon aluminum killed steel plate, washing the defatted steel plate with an acid, and immersing the washed steel plate in a melt having Al and Sn dissolved therein together. The Al-Sn film was found to have a thickness of 0.6 to 4.1 μm and to contain 5.1 to 58% by weight of Sn.

COMPARATIVE EXAMPLE

Three samples (sample Nos. 15-17) were prepared by forming a Sn film or a Cr+Crox film on the surface of a steel plate as used in Example 1 by means of electroplating technique.

Each of sample Nos. 1 to 17 thus prepared was tested for the DI processing capability and corrosion resistance.

Each of sample Nos. 1 to 17 of the surface treated steel plate thus prepared was subjected to tests to evaluate the DI processing capability and corrosion resistance. For evaluating the DI processing capability, each sample was punched in a disk shape having a diameter of 123 mm, followed by forming the disk-shaped sample into a cup having an inner diameter of 72 mm and a height of 36 mm by using a cupping machine available on the market. The cup thus prepared was subjected to a redrawing treatment using a DI machine having a coolant of 40° C. circulated therein. The redrawing treatment was carried out under a punch speed of 30 m/min and a stroke of 600 mm, followed by applying a three-stage ironing treatment. The resultant can body was found to be 52 mm in inner diameter and 130 mm in height. Further, the thickness of the steel plate forming the barrel portion of the can body was found to be about half the original thickness. For determining the DI processing capability, the energy required for forming the can body was calculated on the basis of the forming load and the amount of deformation. The DI processing capability was evaluated by the calculated value. Incidentally, the smaller value of the forming energy represents the better DI processing capability. Also evaluated was a stripping capability, i.e., the force required for withdrawing the punch from the formed can body. Naturally, the smaller value of the required force represents the better stripping capability.

The corrosion resistance was evaluated by applying an HCT test (wet test) which was intended to examine the weatherability, and a UCC test and an IPV test, which were intended to examine the corrosion resistance of the steel plate having a protective metallic surface layer plated thereon.

For performing the HCT test, the formed can body was defatted and washed, followed by sealing the back surface and end surface of the can body. The can body under this condition was put in a wet environment having a temperature of 50° C. and a humidity of 80% so as to observe the rusting of the can body.

The UCC test was applied to the can body which had been defatted, washed and, then, coated with a paint for cans. To be more specific, a vinyl modified alkyd resin was baked in a thickness of about 50 μm onto the outer surface of the can body. On the other hand, the inner surface of the can body was coated in a thickness of 50 μm with a copolymer paint comprising vinyl chloride monomers, vinyl acetate monomers and maleic acid monomers. A test piece was cut out of the coated can body in a size of 50 mm×70 mm, and a cross cutting was applied to the test piece to selectively remove the coating so as to expose the surface of the surface treated steel plate. Further, the back surface and the edge portions, which were out of the tested region, of the test piece were sealed. The test piece thus prepared was kept immersed in a corroding solution for 96 hours and, then, a tape was attached to the coated film of the test piece. The tape was peeled off the test piece so as to observe the width of corrosion and the state of removal of the coated film together with the tape. An aqueous solution of 35° C. containing 1.5% of citric acid and 1.5% of sodium chroride was used as the corroding solution.

The IPV test is for measuring the amount of iron eluted from the can body into the liquid material housed in the can. For performing the IPV test, 250 ml of Coca-Cola was loaded in the can body and preserved at 38° C. for 6 months. After the preservation, the iron ions eluted from the can body were quantitatively analyzed.

Table 1 shows the results of these tests. As seen from table 1 the samples according to the embodiment of the present invention were low in the forming energy and satisfactory in the stripping capability. Also, the surface treated steel plates according to the embodiment of the present invention were found to be free from deterioration of the protective surface film and to be satisfactory in corrosion resistance in each of the inner and outer surfaces. Particularly, samples Nos. 7 to 10, in which a chromium film was formed by the ion plating technique below the Al-Sn alloy film, were found to exhibit an excellent corrosion resistance. On the other hand, the tin-plated steel plate (sample No. 15) for the Comparative Example was found to be satisfactory in the DI processing capability, but was poor in the corrosion resistance. Further, in the case of the chromium-plated steel plates (sample Nos. 16 and 17) for the Comparative Example, biting took place between the surface of the sample and the die. Also, a high forming energy was required in these samples. As apparent from Table 1, the samples according to the embodiment of the present invention were found to be superior to the samples for the Comparative Example in every test item.

TABLE 1

| | No. | Alloy Film Mfg Method | Alloy Film Composition | Thickness (μm) | Presence of lubricating film | DI formability Forming energy (J) | DI formability Stripping (kg) | Corrosion Resistance HCT test | Corrosion Resistance UCC test | IPV value (ppm) |
|---|---|---|---|---|---|---|---|---|---|---|
| Example 1 | 1 | VD (co-deposition) | Al—Sn (Sn 5%) | 3.2 | none | 3116 | 89 | ◯ | ◯ | tr |
| | 2 | VD (co-deposition) | Al—Sn (Sn 6%) | 0.7 | " | 3267 | 97 | ◯ | ◯ | tr |
| | 3 | VD (co-deposition) | Al—Sn (Sn 11%) | 2.4 | " | 3110 | 85 | ◯ | ◯ | tr |
| | 4 | VD (co-deposition) | Al—Sn (Sn 21%) | 1.0 | " | 3165 | 72 | ◯ | ◯ | tr |
| | 5 | VD (co-deposition) | Al—Sn (Sn 30%) | 4.3 | " | 3092 | 68 | ◯ | ◯ | tr |
| | 6 | VD (co-deposition) | Al—Sn (Sn 48%) | 0.5 | " | 3084 | 61 | ◯ | ◯ | tr |
| | 7 | upper layer VD | Al—Sn (Sn 11%) | 3.7 | " | 3065 | 60 | ◉ | ◉ | tr |
| | | lower layer ADIP | Cr | 0.03 | | | | | | |
| | 8 | upper layer VD | Al—Sn (Sn 19%) | 2.1 | " | 3124 | 69 | ◉ | ◉ | tr |
| | | lower layer ADIP | Cr | 0.09 | | | | | | |
| | 9 | upper layer VD | Al—Sn (Sn 38%) | 0.7 | " | 3218 | 65 | ◉ | ◉ | tr |
| | | lower layer ADIP | Cr | 0.15 | | | | | | |
| | 10 | upper layer VD | Al—Sn (Sn 54%) | 0.6 | " | 3041 | 59 | ◉ | ◉ | tr |
| | | lower layer ADIP | Cr | 0.75 | | | | | | |
| Example 2 | 11 | melting method | Al—Sn (Sn 5.1%) | 2.3 | " | 3216 | 121 | ◯ | ◯ | tr |
| | 12 | melting method | Al—Sn (Sn 15%) | 4.1 | " | 3094 | 72 | ◯ | ◯ | tr |
| | 13 | melting method | Al—Sn (Sn 24%) | 1.2 | " | 3100 | 80 | ◯ | ◯ | tr |
| | 14 | melting method | Al—Sn (Sn 58%) | 0.6 | " | 3043 | 63 | ◯ | ◯ | tr |
| Comparative Example | 15 | electroplating | Sn | 0.78 | " | 3722 | 324 | ◯ | △ | 5 |
| | 16 | electroplating | Cr + Crox | 0.03 | " | 4500 (biting) | 600 | x | x | more than 50 |
| | 17 | electroplating | Cr + Crox | 0.03 | formed (outer surface) | 3010 | 200 | x | x | more than 50 |

Notes:
VD: Vapor Deposition
ADIP: Arc Discharge Ion Plating
Sn content: (% by weight)
Evaluation of HCT and UCC tests:
◉ ... very good; ◯ ... good; △ ... somewhat poor; x ... poor
The lubricating film referred to in Table 1 was prepared by baking for 10 minutes at 205° C. a film of vinyl chloride organo sol containing Teflon type polyethylene-series wax disclosed in Published Unexamined Japanese Patent Application No. 61-112738.

As described above in detail, the surface treated steel plate of the present invention comprises an Al-Sn alloy film formed on the surface of the steel plate. The Al-Sn alloy exhibits an excellent corrosion resistance. In addition, the Sn contained in the alloy film performs the function of a lubricant. It follows that the surface treated steel plate of the present invention exhibits prominant DI processing capability and corrosion resistance far superior to those exhibited by the conventional tin-plated steel plate. What should also be noted is that the surface treated steel plate of the present invention makes it unnecessary to employ after-treatments such as a treatment with phosphoric acid, leading to a low manufacturing cost of the can. The prominent effects of the present invention are believed to contribute to the further progress of the can-manufacturing technology.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A surface treated steel plate for cans, comprising: a steel plate; and an Al-Sn alloy film formed in a thickness of 0.05 to 5.0 μm on at least that surface of the steel plate which faces the outside when the steel plate is drawn to have a cup shape.

2. The surface treated steel plate for cans according to claim 1, wherein said steel plate is a low carbon aluminum killed steel plate having a thickness of 0.10 mm to 0.5 mm and prepared by the process comprising cold rolling, defatting and acid washing treatments.

3. The surface treated steel plate for cans according to claim 1, wherein said Al-Sn alloy film is formed on each surface of the steel plate.

4. The surface treated steel plate for cans according to claim 1, wherein said Al-Sn alloy film has a thickness of 0.05 to 5 μm and consists of 1 to 60% by weight of Sn and the balance of Al and unavoidable impurities.

5. The surface treated steel plate for cans according to claim 4, wherein said Al-Sn alloy film has a thickness of 0.05 to 5 μm and consists of 5 to 60% by weight of Sn and the balance of Al and unavoidable impurities.

6. The surface treated steel plate for cans according to claim 4, wherein said Al-Sn alloy film has a thickness of 0.05 to 4.3 μm and consists of 5 to 48% by weight of Sn and the balance of Al and unavoidable impurities.

7. The surface treated steel plate for cans according to claim 4, wherein said Al-Sn alloy film has a thickness of 0.6 to 4.1 μm and consists of 5.1 to 58% by weight of Sn and the balance of Al and unavoidable impurities.

8. A surface treated steel plate for cans, comprising:
a steel plate; and
a chromium or chromium alloy film formed in a thickness of 0.01 to 1.0 nm on at least that surface of the steel plate which faces the outside when the steel plate is drawn to have a cup shape; and
an Al-Sn alloy film formed in a thickness of 0.05 to 5.0 μin contact with the chromium or chromium alloy film.

9. The surface treated steel plate for cans according to claim 8, wherein said steel plate is a low carbon aluminum killed steel plate having a thickness of 0.10 mm to 0.5 mm and prepared by the process comprising cold rolling, defatting and acid washing treatments.

10. The surface treated steel plate for cans according to claim 8, wherein each of said Al-Sn alloy film and said chromium alloy film is formed on each surface of the steel plate.

11. The surface treated plate for cans according to claim 8, wherein said Al-Sn alloy film has a thickness of 0.6 to 3.7 82 m and consists of 11 to 54% by weight of Sn and the balance of Al and unavoidable impurities, and said chromium or chromium alloy film has a thickness of 0.03 to 0.75 μm.

12. A drawn and ironed can, comprising a cup-shaped body including a bottom portion and a barrel portion, said cup-shaped body being formed of the surface treated steel plate defined in claim 1 and the steel plate in the barrel portion being thinner than the steel plate in the bottom portion.

13. A drawn and ironed can, comprising a cup-shaped body including a bottom portion and a barrel portion, said cup-shaped body being formed of the surface treated steel plate defined in claim 8 and the steel plate in the barrel portion being thinner than the steel plate in the bottom portion.

* * * * *

UNITED STATES PATENT AND TRADEMARK OFFICE
CERTIFICATE OF CORRECTION

PATENT NO. : 5,013,614
DATED : May 7, 1991
INVENTOR(S) : YASUE et al

It is certified that error appears in the above-identified patent and that said Letters Patent is hereby corrected as shown below:

Column 10, line 9 (Claim 11):

Change "0.6 to 3.7 82m" to read --0.6 to 3.7 $\mu$m--.

Signed and Sealed this

Fourth Day of May, 1993

Attest:

MICHAEL K. KIRK

*Attesting Officer*  *Acting Commissioner of Patents and Trademarks*